United States Patent
Kuehlmann et al.

(10) Patent No.: US 8,862,439 B1
(45) Date of Patent: Oct. 14, 2014

(54) GENERAL NUMERIC BACKTRACKING ALGORITHM FOR SOLVING SATIFIABILITY PROBLEMS TO VERIFY FUNCTIONALITY OF CIRCUITS AND SOFTWARE

(75) Inventors: Andreas Kuehlmann, Kensington, CA (US); Kenneth L. McMillan, Berkeley, CA (US); Shmuel Sagiv, Tel Aviv (IL)

(73) Assignee: Cadence Design Systems, Inc., San Jose, CA (US)

( * ) Notice: Subject to any disclaimer, the term of this patent is extended or adjusted under 35 U.S.C. 154(b) by 518 days.

(21) Appl. No.: 12/824,081

(22) Filed: Jun. 25, 2010

Related U.S. Application Data

(60) Provisional application No. 61/220,574, filed on Jun. 25, 2009, provisional application No. 61/222,478, filed on Jul. 1, 2009.

(51) Int. Cl.
```
G06F 7/60      (2006.01)
G06F 9/455     (2006.01)
G06F 11/22     (2006.01)
G06F 11/00     (2006.01)
G06F 17/50     (2006.01)
G06F 17/10     (2006.01)
```

(52) U.S. Cl.
CPC .............. *G06F 17/504* (2013.01); *G06F 17/10* (2013.01)
USPC .................. 703/2; 716/11; 716/136; 714/738

(58) Field of Classification Search
CPC ..................................................... G06F 17/504
USPC ............ 703/2; 716/107, 103, 106; 706/46–47
See application file for complete search history.

(56) References Cited

U.S. PATENT DOCUMENTS

| | | | |
|---|---|---|---|
| 5,842,203 A * | 11/1998 | D'Elena et al. | 1/1 |
| 6,212,669 B1 * | 4/2001 | Jain | 716/107 |
| 6,473,884 B1 * | 10/2002 | Ganai et al. | 716/107 |
| 6,496,961 B2 * | 12/2002 | Gupta et al. | 703/2 |
| 6,591,400 B1 * | 7/2003 | Yang | 716/106 |
| 6,728,665 B1 * | 4/2004 | Gupta et al. | 703/2 |
| 6,816,825 B1 * | 11/2004 | Ashar et al. | 703/14 |
| 6,944,838 B2 * | 9/2005 | McMillan | 716/106 |
| 7,047,139 B2 * | 5/2006 | Shtrichman | 702/22 |
| 7,058,910 B2 * | 6/2006 | Bharadwaj et al. | 703/2 |
| 7,283,945 B2 * | 10/2007 | Rajan | 703/17 |
| 7,401,305 B2 * | 7/2008 | Shacham et al. | 716/106 |

(Continued)

OTHER PUBLICATIONS

Minimizing Conflicts: A Heuristic Repair Method for Constraint-Satisfaction and Scheduling problems; Steven Minton et al Journel of Artificial Intelligence Research 1, pp. 25-32. Published Sep. 1991.*

*Primary Examiner* — Akash Saxena
(74) *Attorney, Agent, or Firm* — Alford Law Group, Inc.

(57) ABSTRACT

In one embodiment of the invention, a design verifier is disclosed including a model extractor and a bounded model checker having an arithmetic satisfiability solver. The arithmetic satisfiability solver searches for a solution in the form of a numeric assignment of numbers to variables that satisfies each and every one of the one or more numeric formulas. Conflict in the search, results in the deduction of one or more new numeric formulas that serve to guide the search toward a solution. If the search finds a numeric assignment that satisfies each and every one of the one or more numeric formulas, it indicates that a functional property of the system is violated.

20 Claims, 7 Drawing Sheets

(56) References Cited

U.S. PATENT DOCUMENTS

| | | | |
|---|---|---|---|
| 7,406,405 B2 * | 7/2008 | McMillan et al. | 703/2 |
| 7,562,322 B2 * | 7/2009 | Lu | 716/106 |
| 7,587,707 B2 * | 9/2009 | Ball et al. | 717/117 |
| 7,661,082 B1 * | 2/2010 | McMillan et al. | 716/106 |
| 7,921,411 B2 * | 4/2011 | Chockler et al. | 717/126 |
| 7,937,673 B1 * | 5/2011 | Kurshan et al. | 716/102 |
| 8,020,125 B1 * | 9/2011 | Kuehlmann et al. | 716/106 |
| 8,103,999 B1 * | 1/2012 | Martensson | 716/106 |
| 8,131,660 B2 * | 3/2012 | Davis et al. | 706/46 |
| 8,140,459 B2 * | 3/2012 | Bjorner et al. | 716/106 |
| 8,234,609 B2 * | 7/2012 | Kurshan et al. | 716/106 |
| 8,407,175 B2 * | 3/2013 | Fuhrmann et al. | 706/46 |
| 8,656,330 B1 * | 2/2014 | Kuehlmann et al. | 716/111 |
| 2002/0123867 A1 * | 9/2002 | Shtrichman | 703/2 |
| 2003/0225552 A1 * | 12/2003 | Ganai et al. | 703/2 |
| 2004/0006451 A1 * | 1/2004 | Bharadwaj et al. | 703/2 |
| 2004/0230407 A1 * | 11/2004 | Gupta et al. | 703/2 |
| 2007/0011629 A1 * | 1/2007 | Shacham et al. | 716/3 |
| 2007/0179920 A1 * | 8/2007 | Zhang | 706/19 |
| 2008/0250376 A1 * | 10/2008 | Burch et al. | 716/13 |
| 2009/0019040 A1 * | 1/2009 | Purcell et al. | 707/5 |
| 2010/0005454 A1 * | 1/2010 | Sankaranarayanan et al. | 717/127 |
| 2011/0093431 A1 * | 4/2011 | Arbel et al. | 706/57 |
| 2011/0154278 A1 * | 6/2011 | Caldwell et al. | 716/103 |
| 2011/0173148 A1 * | 7/2011 | Ganai et al. | 706/46 |

* cited by examiner $$\text{while } A \not\models S \text{ and FALSE} \notin S \text{ do}$$
$$\left\{\begin{array}{c} 1) \text{ set } A \leftarrow A', \text{ where } A \triangleright A' \text{ and } (S, A) \succ (S, A') \\ \text{or} \\ 2) \text{ set } S \leftarrow S', \text{ where } S' = S \cup \{s\}, S \vdash s \text{ and } (S, A) \succ (S', A) \end{array}\right\}$$

FIG. 5

Algorithm: GNBA For QFLRA
Input: a set $S$ of clauses of QFLRA
Output: a satisfying assignment for $S$, or UNSAT Let $\sqsubset$ be some total order on $x_1 \ldots x_n$
    Let $A$ be a structure of QFLRA
    repeat
        if $A \models S$ return $A$
        if FALSE $\in S$ return UNSAT
        let $x_1$ be the least variable w.r.t. $\sqsubset$ such that $A(x_j) \notin \text{feas}_\sqsubset (A, S, x_j)$
        if $\text{feas}_\sqsubset (A, S, x_j)$ is not empty
            choose $r \in \text{feas}_\sqsubset (A, S, x_j)$ and set $A \leftarrow A\ (r/x_j)$
        else if there exists strictly compatible $(s,s')$ in $\text{minim}_\sqsubset (A, S, x_j)$
            set $S \leftarrow S \cup \{\text{shad}_{x_j}(s,s')\}$
        else *abort*

FIG. 6

$$\frac{C \vee \ell_1 \bowtie_1 x_j \vee \cdots \vee \ell_m \bowtie_m x_j \quad\quad C' \vee x_j \bowtie'_1 u_1 \vee \cdots \vee x_j \bowtie'_{m'} u_{m'}}{C \vee C' \vee \bigvee_{j=1\ldots m} \bigvee_{j'=1\ldots m'} (\ell_j \bowtie_j \bowtie'_{j'} u_{j'})}$$

$x_j$ not occurs in $\ell_{1\ldots m}, u_{1\ldots m'}$
$C$ does not lower-bound $x_j$
$C'$ does not upper-bound $x_j$

FIG. 7

GENERAL NUMERIC BACKTRACKING ALGORITHM FOR SOLVING SATIFIABILITY PROBLEMS TO VERIFY FUNCTIONALITY OF CIRCUITS AND SOFTWARE

CROSS-REFERENCE TO RELATED APPLICATIONS

This non-provisional United States (U.S.) patent application claims the benefit of U.S. Provisional Patent Application No. 61/220,574 entitled GENERAL NUMERIC BACKTRACKING BASED ALGORITHM FOR SOLVING BOOLEAN SATISFIABILITY PROBLEMS TO VERIFY FUNCTIONALITY OF CIRCUITS AND SOFTWARE filed on Jun. 25, 2009 by inventors Andreas Kuehlmann et al. and also claims the benefit of U.S. Provisional Patent Application No. 61/222,478 entitled GENERAL NUMERIC BACKTRACKING BASED ALGORITHM FOR SOLVING BOOLEAN SATISFIABILITY PROBLEMS TO VERIFY FUNCTIONALITY OF CIRCUITS AND SOFTWARE filed on Jul. 1, 2009 by inventors Andreas Kuehlmann et al., both of which are incorporated herein by reference in their entirety.

FIELD OF THE INVENTION

Embodiments of the invention relate generally to software tools for design verification of hardware and software.

BACKGROUND INFORMATION

In designing large dynamic systems such as, for example, a complex electronic circuit, the design is often analyzed to verify a selected property. For example, the design may need to be analyzed to verify that the system does not enter a certain failed or erroneous state under any normal set of inputs to the system in any finite number of steps (e.g., a safety property).

Several Boolean satisfiability solvers (also referred to as SAT solvers) are known that can determine whether the system may enter a given failed state within a selected number of steps. Typically, the Boolean SAT solver searches for a counterexample to a given safety property. A counterexample is a sequence of input values to the system that will cause the system to enter the failed state within the selected number of steps.

If the Boolean SAT solver finds a counterexample within K steps, the counterexample indicates an error in the design, and can aid the designer in redesigning the system to ensure that the failed state is not entered. If the Boolean SAT solver finds that there is no counterexample within K steps, the designer's confidence in the correctness of the design is increased.

Boolean SAT solvers require a model of a design to be represented as Boolean operatives such as NAND, NOR, AND, OR, and NOT functions with Boolean variables. At such a low level description, extensive computing resources may be needed to perform verification of a complex design. Moreover, the time to perform verification of a complex design may be lengthy. Thus, it is desirable to improve upon Boolean SAT solvers for the purpose of design verification.

BRIEF DESCRIPTION OF THE DRAWINGS

Non-limiting and non-exhaustive embodiments of the present invention are described with reference to the following figures, wherein like reference numerals refer to like parts throughout the various views unless otherwise specified.

FIG. 5 illustrates pseudo code for the general numeric backtracking algorithm (GNBA).

FIG. 6 illustrates pseudo code for the GNBA algorithm as applied to quantifier-free linear rational arithmetic (QFLRA).

FIG. 7 illustrates the general form of the shadow rule.

BRIEF SUMMARY OF THE INVENTION

Figure 1:
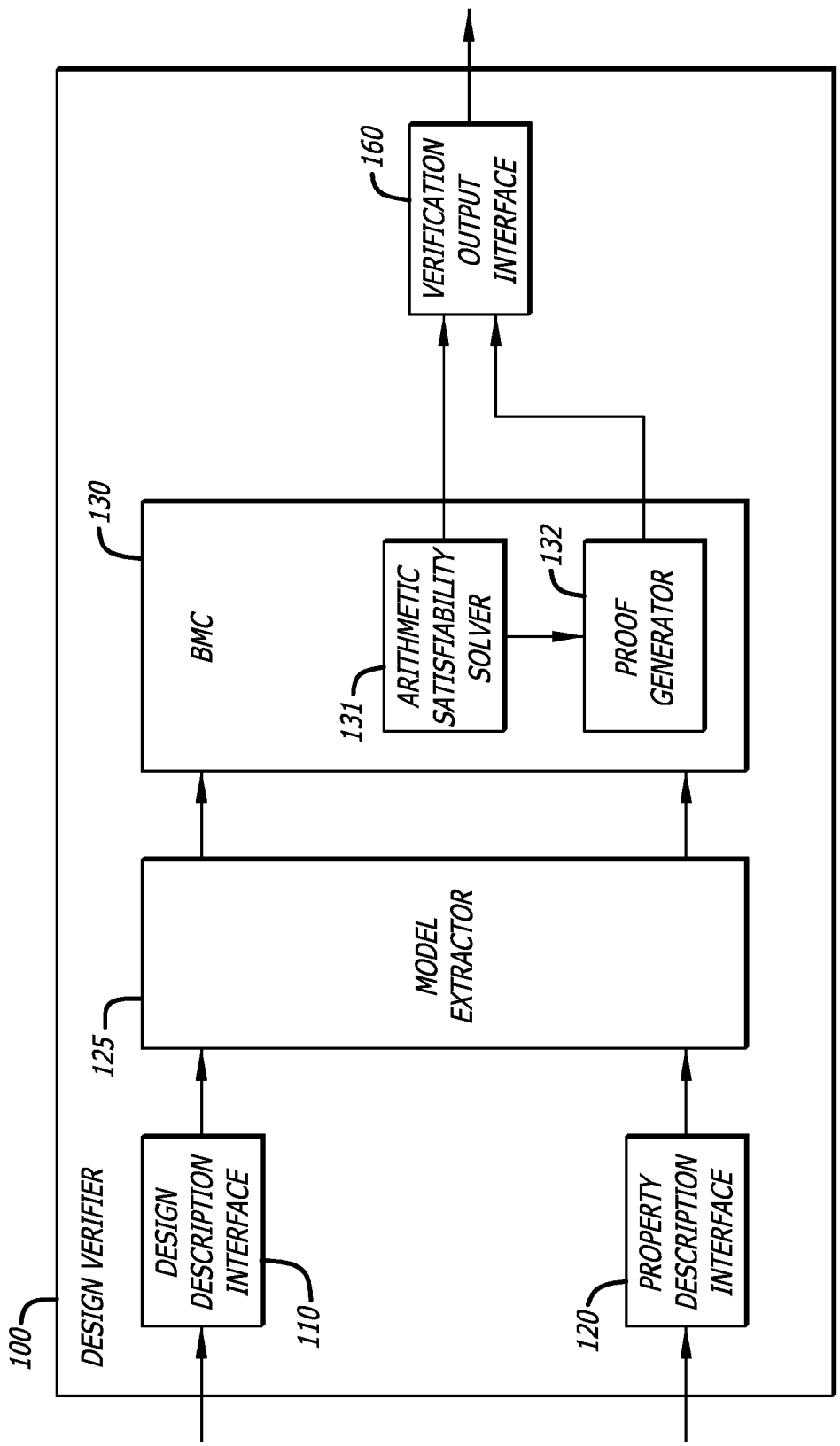
FIG. 1 is a block diagram illustrating modules implementing a design verifier according to one embodiment of the invention.

While a summary of the invention is provided here, the embodiments of the invention are best summarized by the claims that follow below.

A general numeric backtracking algorithm (GNBA) is disclosed to verify software and hardware designs. The GNBA algorithm is a general approach to solving systems of constraints, expressed in a variety of notations, or proving that no such solutions exist. In addition to Boolean logical operators (e.g., NAND, NOR, and NOT gates), the GNBA algorithm can directly handle higher level arithmetic functions (e.g., adders, multipliers, multiplexers or their functions). The GNBA algorithm can be used as a proof search and model search strategy for a range of logics and proof calculi when certain general conditions are met.

DETAILED DESCRIPTION

In the following detailed description, numerous specific details are set forth. However, it is understood that embodiments of the invention may be practiced without these specific details. In other instances, well-known circuits, structures, and techniques have not been shown in detail in order to not obscure the understanding of this description. These embodiments are described in sufficient detail to enable those of ordinary skill in the art to practice the invention. The following detailed description is, therefore, not to be taken in a limiting sense, and the scope of the invention is defined only by the appended claims.

Introduction

In hardware and software verification, many important problems can be reduced to the problem of satisfiability of a formula in some logic. Commonly, Boolean (or propositional) logic is used for this purpose. A Boolean formula consists of Boolean variables combined with logical connectives, such as AND, OR and NOT. A formula is said to be satisfiable if there is some assignment of truth values to the variables that makes the formula true. Such an assignment is called a model of the formula. The problem of determining whether a Boolean formula has a model is called the Boolean satisfiability problem (SAT) and is a computationally challenging problem in the NP-complete complexity class.

For reasons of efficiency and expressiveness, it is desirable to use richer logical notations than Boolean logic, to allow a hardware or software system to be described at a higher level of abstraction. In such a case, we may allow logical formulas to contain variables that represent integers or arrays, operators on these values such as addition and multiplication, and predicates such as equality. A model of such a formula might be an assignment of numeric values to the variables. The problem of satisfiability in this case is often referred to as SAT modulo theories (SMT) since we seek an assignment of truth values to predicates occurring in the formula that is consistent with an underlying theory (for example, a theory of arithmetic). We will refer to modeling of a system in such a logic as word-level modeling, since it allows us to treat words and higher level data structures as a whole, without dividing them into individual bits.

A procedure that determines that satisfiability of a formula is known as a decision procedure for the given logic. Commonly, such a procedure can provide a proof of unsatisfiability (refutation) in the unsatisfiable case. The search for a model and the search for a refutation are typically tightly coupled.

The Davis-Putnam-Logemann-Loveland (DPLL) algorithmic approach to SAT is a combination of a search for a model and logical refutation, in which each process guides the other. This approach has been found highly effective in finding errors in hardware and software modeled at the bit level. For word-level modeling, a lazy approach to SMT is commonly used. This approach combines theory solvers (for example linear arithmetic solvers) with a DPLL SAT solver. The theory solver provides axioms of the theory to the SAT solver 'on demand', in response to proposed truth assignments to the predicates in the formula. A disadvantage of this approach is that the theory solver lacks heuristic guidance as to which axioms will result in an efficient overall proof search.

To solve this problem, the General Numeric Backtracking Algorithm (GNBA), disclosed herein, applies the DPLL approach directly to the theory. A search for a model in the space of theory structures (e.g., numerical assignments) rather than Boolean assignments is made. This makes it possible to use conflict in model search to guide deduction in the theory, much in the way that it guides propositional deduction in DPLL. This results in a more efficient procedure for solving SMT.

More efficient decision procedures in turn lead to more efficient word-level formal verification methods.

Design Verifier

Referring now to FIG. 1, a block diagram of a design verifier 100 is illustrated in accordance with an embodiment of the invention. The design verifier 100 is implemented using machine-readable instructions that cause a machine (e.g., a processor, a computer, or a work station) to perform operations that allow the machine to receive a design description of a system (e.g., a design description of an electronic circuit or computer program) and verify whether a property or properties of the design is satisfied.

The design verifier 100 includes software modules implementing a design description interface 110, a property description interface 120, a model extractor 140, a bounded model checker (BMC) 130, and a verification output interface 160 in communication together as shown. The bounded model checker (BMC) 130 has an SMT solver for arithmetic (arithmetic solver) and may also have a proof generator 132. The use of an arithmetic solver is exemplary, as other theories may equally be applied. In one embodiment, these software modules are implemented using machine-readable instructions.

Design description interface 110 and property description interface 120 are configured to receive a hardware description language (HDL) design description and property description from a source(s) external to the interfaces (e.g., a file) and to provide outputs to the model extractor 125.

The model extractor 125 extracts one or more numeric models in response to the output generated by the design description interface 110 and the property description interface 120. The one or more numeric models formed by the model extractor 125 are communicated to the bounded model checker 130.

The bounded model checker 130 can determine whether the given hardware or computer program violates a desired property within K steps of execution, where K is a specified bound. It includes the arithmetic SMT solver 131, which in turn is configured to provide an output to the verification output interface 160. Bounded model checker 130 reduces the problem of K-step correctness to an SMT problem, which is communicated to arithmetic SMT solver 131. It may further include the proof generator 132. In which case, the arithmetic SMT solver 131 may be further configured to provide an output to the proof generator 132. The proof generator 132 is in turn configured to provide an output to the verification output interface 160. The proof generator 132 is configured to record the inferences generated by the bounded model checker 130, including clauses derived as a response to conflicts in the search for a model. The proof generator 132 may include a proof-based abstractor or a proof partitioner (interpolator), depending on the use case.

A proof-based abstractor can abstract the design description using the proof recorded by proof generator 132. The proof-based abstractor abstracts the design description by deleting all constraints (logical formulas) not involved in any of the inferences of the recorded proof. More particularly, it deletes any constraint having none of its clauses present in any inference step. A constraint will be said to be present in the proof if any instance of one of its clauses is present. An abstracted design description can have a significantly smaller number of constraints relative to the full design description.

It can be shown that this type of abstraction will not invalidate the proof and thus the abstracted design description is also guaranteed not to violate the desired property in K steps (or fewer). One way to think of this attribute of the abstraction is that the deleted constraints were not relevant to the property that is being verified, at least within K steps. Thus, if K is large enough, it is reasonable to expect that removing these constraints will have no effect on the truth of the property in general. Thus, the abstraction may be used to prove that the property is never violated in any number of execution steps using unbounded model checking methods.

Generally, the bounded model checker 130 performs a bounded model checking algorithm on the transformed design and property description. The output of bounded model checker 130 may indicate that the property can be violated (in which case, a violating execution trace or counterexample is provided) or it may indicate that the property is true for all design behaviors. Exemplary operation of design verifier 100 is described below.

Figure 2:
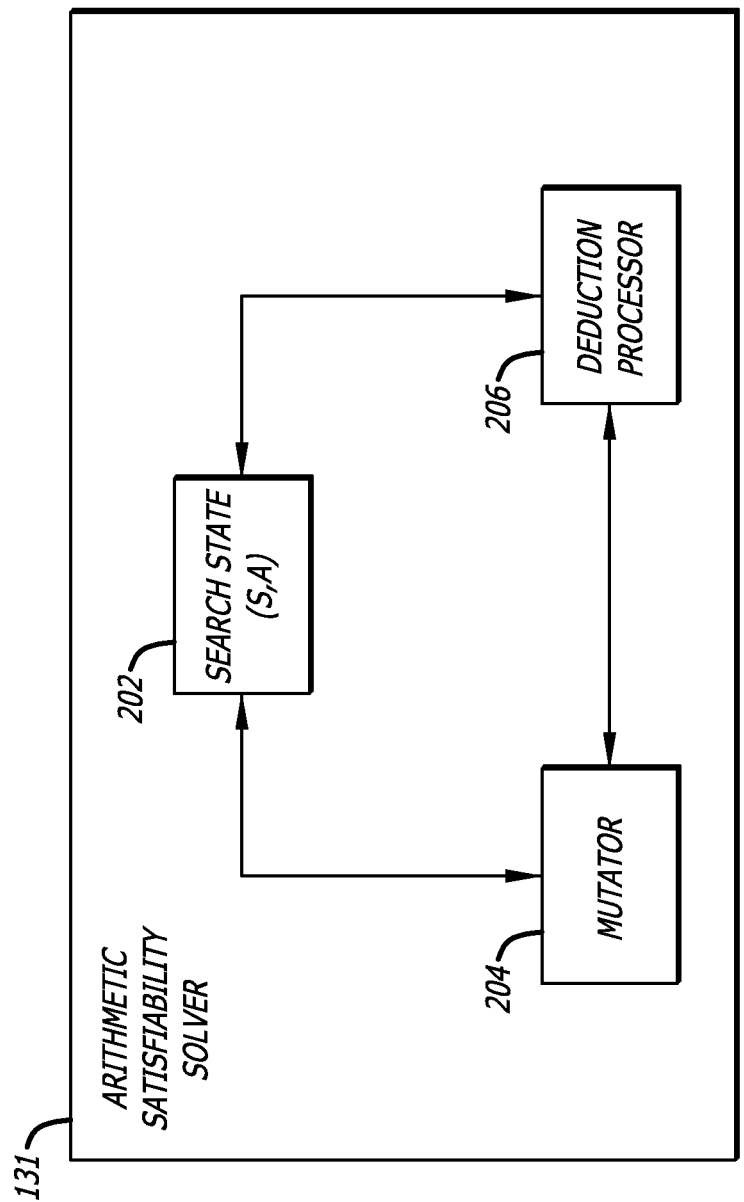
FIG. 2 is a functional block diagram of the arithmetic satisfiability solver shown in FIG. 1.

Referring now to FIG. 2, a block diagram of the arithmetic SMT solver 131 is shown. The arithmetic SMT solver 131 includes a search state 202, a mutator 204, and a deduction processor 206 coupled in communication together as shown.

The mutator 204 performs modification to the search state in an attempt to bring the state closer to a satisfying assignment. When such a modification is not possible, the search is in 'conflict'. In this case, the deduction processor 206 derives a new clause (logical formula) that resolves the conflict, allowing the mutation process to continue. The function of the derived clauses is to guide the search away from areas of the search space that contain no satisfying assignments. The search state 202 represents an attempt to construct a numerical model of the formula. From the search state, a satisfying assignment may be derived which may be coupled to the verification output interface 160. In the unsatisfiable case, a proof may be derived from the search state and coupled to the proof generator 132.

General Numeric Backtracking Algorithm (GNBA)

A framework for a general numeric backtracking algorithm (GNBA) is now described abstracted away from particular logics used to model software or hardware. This framework can be used as a proof search and model search strategy for a range of logics and proof calculi, provided certain general conditions are met.

Let $\mathcal{L}$ be a logical language, that is, a set of sentences s. A subset of the logical language $\mathcal{L}$ is a theory. The semantics of the logical language $\mathcal{L}$ is defined by the satisfaction relation (or semantic entailment relation) indicated by the symbol $\models$. Given a logical structure A (for example, a numerical assignment) and a sentence s, the notation A|s indicates that A satisfies s, or a is a model of s. Alternatively, it may be stated that is true in A. Non-standard structures and semantics are allowed and may be used provided that when logical structure A satisfies a sentence s (A|=s) this implies that the sentence s is satisfiable in the standard semantics. In particular, a three-valued semantics may be used so that possibly the logical structure A does not satisfy a sentence a (A|≠a) and the logical structure A also does not satisfy the sentence NOT a (A|≠¬ a). It is assumed that the logical language $\mathcal{L}$ contains a false sentence (F or False) that has no models (in the standard semantics).

The GNBA algorithm can be thought of as a search process. The state of the search is a pair (S,A), where S is a set of sentences and A is a logical structure. FIG. 2 illustrates a block diagram of the search state 202 that stores a pair (S,A) consisting of a set of sentences S and the logical structure A. The search goal is to reach a state in which the logical structure satisfies the set of sentences (A|=S). As with most searches, a heuristic function is used to measure progress toward reaching the search goal. The heuristic can be defined in terms of a partial order >ranking search states. That is, if the search state pair (S,A) has a higher ranking than another search state pair (S',A'), that is (S,A)>(S',A'), then in some heuristic sense, the lower ranked search state (S',A') is closer to the goal.

Moves in the search space from one search state to another are defined by a mutation relation $\triangleright$ and a deduction relation $\vdash$. The mutation relation is a relation on the logical structures. If the logical structures A and A' are related by the mutation relation, that is A' is a mutation of A (A $\triangleright$ A'), the search state for the logical structure can move from the logical structure A to the mutated logical structure A'. The mutator 204 shown in FIG. 2 generates the mutated logical structure in the search process. The deduction relation allows one or more sentences s to be added to the set of sentences S of the search state pair. That is, if the set of sentences S implies a sentence s (S $\vdash$ s), then the sentence s may be added to the set of sentences S of the search state. The deduction processor 206 shown in FIG. 2 deduces one or more sentences s that may be added to the set of sentences S when the search process is in conflict (when there is no possible mutation that is downward in the heuristic order). The deduction operation $\vdash$ should be sound in the sense that, when a sentence s can be deduced from S (S $\vdash$ s), the sentence s is logically entailed by S (S|=s), meaning s is true in all models of S.

In the search process, mutations of the logical structure may be performed in the downward direction of the heuristic ranking (>) of the search state pairs. To move from one search state (S,A) to another search state (S,A'), where (A $\triangleright$ A'), it is required that the new state (S,A') is lower in the heuristic order than the old state (S,A), that is, (S,A)>(S',A'). When a local minimum is reached in which no mutation can move the search state pair further downward in the ranking, the system is referred to a being in conflict. The state of the local minimum may be escaped by the deduction processor 206 deducing a new sentence s, such that the addition of the new sentence s moves the search state upward in the heuristic order (>) of the search state pairs. Intuitively, new information is learned about the problem such that the search heuristic is refined.

FIG. 5 illustrates pseudo code for the GNBA algorithm. The GNBA algorithm starts with an initial theory S and an arbitrary initial structure A. While the logical structure A is not a model of the set of sentences S and the False sentence F is not deduced, a model search step (1) or a deduction step (2) is repeatedly performed. In a model search step, the logical structure A is mutated to some mutated logical structure A', moving downward in the search state ordered ranking (>). In the deduction step, a new sentence s is deduced, moving upward in the search state ordered ranking (>). This process continues until either the logical structure A is a model of the set of sentences S, or the False sentence F is deduced to be in the set of sentences S.

Correctness

The process described above is a decision procedure for the logical language L, meaning that it always terminates with a satisfying assignment when S is satisfiable, or a derivation of false when S is unsatisfiable. Partial correctness is trivial, since the GNBA algorithmic procedure only terminates with a model of the set of sentences S or a deduction of the False sentence F. To guarantee termination of the GNBA algorithmic procedure, it suffices to establish three key conditions of search progress, boundedness, and deadlock freedom, further described as follows:

Progress: There are no infinite decreasing chains of search states of the form (S,A1)>(S,A2)> ...

Boundedness: The deductive closure of any finite set of sentences S under reduction ($\vdash$) is finite.

Deadlock freedom: In any search state (S,A) where the logical structure A is not a model of the set of sentences S (A|≠S) and the False sentence F (F∉S) is not deduced, either a model search step or a deduction step is possible.

Termination Theorem

Given progress, boundedness and deadlock freedom, the GNBA algorithm terminates. The following describes the proof of GNBA algorithmic termination given these three conditions.

Suppose towards a contradiction that the GNBA algorithm does not terminate. The progress condition assures that model search steps are not executed infinitely. If only model search steps are executed, eventually a search state is reached where no further model search step is possible. By the deadlock freedom condition, a deduction step is possible when in this state. Thus, if termination never occurs, a deduction step is executed infinitely often. However, this is a contradiction, since each deduction step adds a sentence s to the set of sentences S and S is contained in the finite deductive closure of the initial S. This contradiction implies that the algorithm must terminate.

Note that it is also possible to modify the heuristic order of the ranked search states (>) during execution of the GNBA algorithm, provided that the heuristic order of the search states is modified a bounded number of times between deductions. This can allow for dynamic ordering heuristics, such as those typically used in DPLL SAT solvers.

Figure 3:
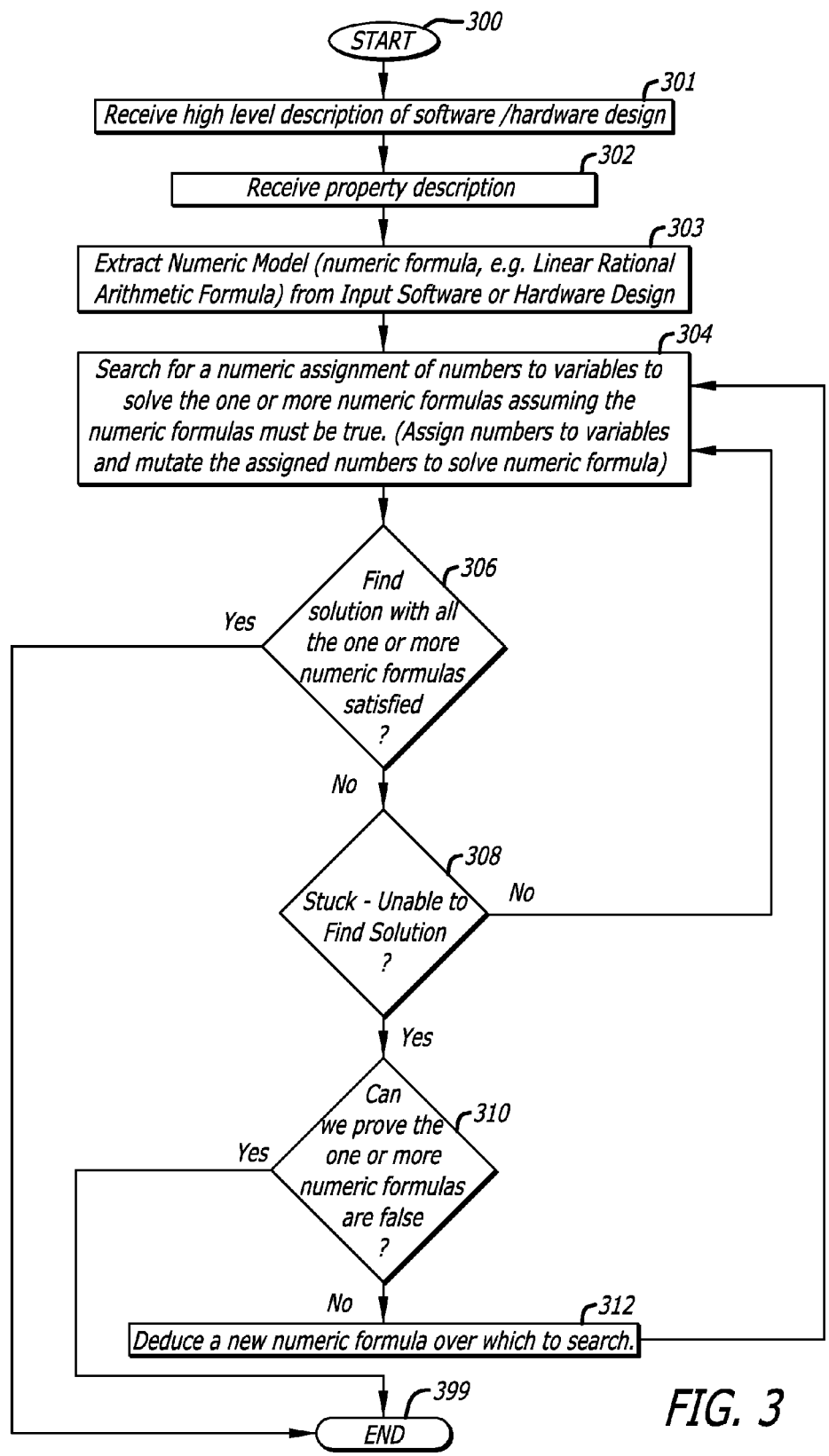
FIG. 3 is a flow chart diagram illustrating an operational flow of the design verifier of FIG. 1, according to one embodiment of the invention.

Referring now to FIG. 3, an operational method of the design verifier 100 using the GNBA algorithm is now described. The process starts at block 300 and then goes to block 301.

At block 301, a high level description of software and/or hardware design is received by the design description interface 110.

At block 302, a property description is received by the property description interface 120. A property description is a sentence of a property written in a property specification language (an example being PSL). A property is some condition that must be true of all possible behaviors of the design. The process then goes to block 303.

At block 303, a numeric or arithmetic model is extracted from the received high level description of the software and/or hardware design. The numeric model is a numeric or arithmetic formula such as a linear rational arithmetic formula, for example. The process then goes to block 304.

At block 304, assuming the numeric formulas must be true, a search for a numeric assignment of numbers to variables to solve the one or more numeric formulas is made. Initial numbers are assigned to the variables and then mutated to solve the one or more numeric formulas. The process then goes to block 306.

At block 306, a determination is made as to whether or not a solution was found so that all of the one or more numeric formulas satisfied. If a solution was found, the process goes to block 399 and ends. Otherwise if a solution is not found, the process goes to block 308 and continues.

At block 308, a determination is made whether or not the search process is stuck and unable to find a solution to all of the one or more numeric formulas. If not, the process goes back to block 304 and continues. If the process is stuck, the process goes to block 310.

At block 310, a determination is made as to where or not it can be proven that one or more numeric formulas are false, referred to as a false sentence F. If there is a false sentence F, the process goes to block 399 and ends. If it can not be proven, the process goes to block 312.

At block 312, a new numeric formula is deduced over which to perform a further search for a solution. The process then return to block 304 to perform a search.

This general framework allows many heuristically useless instantiations. In the extreme, the mutation process performed by the mutator 204 can allow mutation to any structure A', and the deduction process by the deduction processor 206 can deduce a false sentence F in one step from every inconsistent set of sentences S. However in practice, a search space is defined by the model extractor 125 in which mutation and deduction are tractable and not overly non-deterministic.

Linear Rational Arithmetic.

The GNBA algorithm performed by the arithmetic satisfiability solver 131 may be applied to various domains with logical languages and theories. For example, the GNBA algorithm may be applied to integer arithmetic, the theory of arrays, bit vector arithmetic, and linear rational arithmetic.

To better illustrate the concepts of the GNBA algorithm, consider instantiating the general algorithm for quantifier-free linear rational arithmetic (QFLRA). The logical language in this case is formulas of quantifier-free linear rational arithmetic (QFLRA) in clausal form. A sentence (or clause) in this logic, is a disjunction of linear constraints, each of which is of the form $c_0|x|c_1x_1+ \ldots c_nx_n$, where $c_i$ is a rational constant, $x_i$ is a rational variable, and the function $|x|$ is either less than or equal to ($\leq$), or less than (<). Negation is unnecessary because the negation of x being less than or equal to y [¬(x≤y)] can be expressed as y is less than x (y<x). For clarity, constraints may be written with variables on both sides of the function $|x|$, but it should be understood that this is shorthand for a constraint in the normalized form above.

A structure for QFLRA is an assignment of rational values to the variables. A structure is a model of a set of clauses or sentences S if it satisfies every sentence in S according to the usual semantics of arithmetic.

The variable $x_i$ occurs in a constraint if its coefficient $c_i$ in that constraint is non-zero, and it occurs in a clause if it occurs in any literal of the clause. A constraint or clause in which no variable occurs is equivalent to either True or False. A clause equivalent to False and the constant False are not distinguished. Redundant literals are dropped without comment.

A variable is lower-bounded by a constraint if its coefficient is positive. A variable is upper-bounded by a constraint if its coefficient it is negative. It is lower-bounded (upper-bounded) by a clause if lower-bounded (upper-bounded) by any constraint in the clause.

An interval is a connected subset of a rational line Q, the set of rational numbers. Intervals are expressed using the standard notation, as a pair of possibly infinite lower and upper bounds with a square bracket indicating a closed end and a round bracket an open end. For example, the interval (−∞, 5] is the set where the range r is a member of the rational line Q with r being less than or equal to 5 or $\{r \in Q | r \leq 5\}$.

Given a structure A (a function that maps each variable $x_i$ to a rational number) and a clause or sentence s, the feasible set for variable $x_i$, denoted feas(A, s, $x_i$), is the set of rational numbers r such that $A\langle r/x_i\rangle$, and satisfies s. The function $A\langle r/x_i\rangle$, is the same as A, except that $x_i$ is mapped to a new value r. The feasible set is always relative to an assignment A.

For example, consider the assignment (a=0, b=0, c=0) and the clause or sentence (a+5≤b). The feasible set for b is the rational interval [5,∞). The feasible set for variable c is the empty set, since the constraint cannot be made true by substituting any value for c.

GNBA Algorithm for QFRLA

Referring now to FIG. 6, exemplary pseudo code for the GNBA algorithm for quantifier-free linear rational arithmetic (QFLRA) is shown. The algorithm illustrated in FIG. 6 searches for a model of a set of clauses by assigning feasible values to variables in some chosen order. The assigned values are rational rather than Boolean. If a situation is reached in which some variable has no feasible value, there is a conflict. Conflicts are resolved by performing a deduction step. The deduction introduces a new clause or sentence that guides the search process away from the conflict.

To discuss the GNBA algorithm for QFLRA, a running example in which the set S consists of the following clauses or sentences: a is less than b (a<b), a is less than c (a<c), b is less than d or c is less than d (b<dvc<d), and d is less than a (d<a). The initial structure $A_0$ is (a=0, b=0, c=0, d=0).

Let the precedence relation ⊏ be a fixed total order or ranking on the variables. In the running example, the variables are placed in alphabetical order, so that a ranks less than b which ranks less than c which ranks less than d, or (a ⊏ b ⊏ c ⊏ d). Relative to this order, a variable $x_i$ dominates a clause s if $x_i$ is the maximal variable occurring in s, according to the fixed total order. For example, the variable c dominates the clause (a <c). The subset of S dominated by $x_i$ is denoted a domin(S, $x_i$). In the running example, domin(S, c)={(a<c)}.

The ordered feasible set for the variable $x_i$, denoted $feas_c$ (A, S, $x_i$), is the intersection of the feasible sets for $x_i$ over the clauses s in the set S dominated by $x_i$, which can be written in equation form as:

$$feas_c(A,S,x_i) = \cap\{feas(A,s,x_i) | s \in domin(S,x_i)\}$$

In the running example, for the initial structure $A_0$, the ordered feasible set for the variable c is the open interval from zero to infinity, $feas_c(A_0, S, c) = (0,\infty)$. For the initial structure $A_0$, the ordered feasible set for the variable d is empty or null, $feas_c(A_0, S, d) = \emptyset$, since no value of d can satisfy both (b<d $\vee$ c<d) and d<a. A variable $x_i$ is correct if $A(x_i)$, is a member of the ordered feasible set for the variable $x_i$, that is, $A(x_i) \in feas_c(A, S, x_i)$, and incorrect otherwise.

The algorithm shown in FIG. 6 is executed in a loop (repeated) so long as the structure A is not a model of the set of clauses or sentences S and the set S does not contain a clause equivalent to False (in which case there is no model). If the structure A is a model of the set of clauses or sentences S, then the loop terminates and the algorithm returns the structure A as being as a satisfying assignment for the set of clauses or sentences S. If there is a false clause or sentence in the clauses or sentences S, then the loop terminates and the algorithm returns UNSAT, an indication that there is no satisfying assignment for the set of clauses or sentences S.

In the loop of the algorithm shown in FIG. 6, the least incorrect variable $x_i$ is chosen for mutation or modification. In the running example, the least incorrect variable is b, since its feasible set is $(0,\infty)$ and its initial value is zero, that is, $A_0$(b)=0. If the feasible set of $x_i$ is not empty, the variable $x_i$ can be corrected by assigning it some value in its feasible set. This step corresponds to making a "decision" in a DPLL SAT solver. In the running example, any value for b greater than zero can be chosen in a mutation step, for example we can set $A_1$(b)=1. Notice that the mutation of $x_i$ does not modify the feasible sets of any variables ranked or ordered less than the given variable $x_i$. Therefore, with this mutation process, some progress is made towards a satisfying assignment. In the running example, the next mutation produces a structure $A_2$ with the value of c is set to one, that is, $A_2$(c)=1. At this point, the least incorrect variable is d, whose feasible set is empty. Thus, the algorithm state is in conflict.

When a variable $x_i$ has a feasible set that is empty, the conflict is resolved by choosing two clauses $s_1$ and $s_2$ from the set dominated by variable $x_i$ and combining them to deduce a new clause $s_{12}$. The feasible set for variable $x_i$ as defined by the new clause $s_{12}$ is the intersection of the feasible sets defined by the clauses $s_1$ and $s_2$. This is a resolution step to learn a conflict clause.

In the simpler case of a Boolean SAT problem, a conflict entails that, for some Boolean variable $x_i$, there is one clause whose feasible set for $x_i$ is {True} (it implies $x_i$ in the current assignment) and one clause whose feasible set for $x_i$ is {False} (it implies $\neg x_i$ in the current assignment). These two clauses are resolved to obtain a learned clause whose feasible set is the empty set (it is false in the current assignment).

Shadow Rule

In the case of QFLRA, the deduction step is more subtle because the variables are rational rather than Boolean. To resolve a conflict in assigning values to a variable, a deduction rule is used. One suitable deduction rule is the shadow rule. If a pair of clauses ($s_1$, $s_2$) is compatible (as defined herein), this deduction rule produces a new clause $s_{12}$ whose feasible set for $x_i$ is the intersection of the feasible sets for $s_1$ and $s_2$.

FIG. 7 illustrates a generic instance of the shadow rule. The formulas above the line are the premises (formulas $S_1$ and $s_2$ above) and the formula below the line is the conclusion (formula $s_{12}$ above). To express transitivity of inequality in the shadow rule with both strict and non-strict inequalities, the notation |x||x|' is used. Each of the relational notation |x| and |x|' are either the less than relation or function (<) or the less than or equal relation or function ($\leq$). The combined notation |x||x|' stands for less than or equal ($\leq$) if both the notation |x| and |x|' stand for the relation or function less than or equal ($\leq$). Otherwise, the combined notation |x||x|' stands for the less than relation (<) as one of the notation |x| and |x|' stands for the relation or function less than (<). For example, if (x|x| y) and (y|x|'z), then (x|x||x|'z), for all four choices of strict and non-strict comparisons.

Given this, and using distributivity of conjunction over disjunction, the shadow rule is easily shown to be sound. The side conditions of the rule are not needed for soundness. Rather, they restrict deduction so that, from any ordered pair of premises, for any given variable $x_i$, exactly one conclusion can be deduced. To derive this conclusion from a pair of clauses (s, s'), all the lower-bounding constraints from the clause s are gathered and then rewritten in the form $l_j$ |x|$_j$ $x_i$ where $l_j$ is the lower bounding constraint. Similarly, all the upper-bounding constraints of s' are rewritten in the form $x_i$ |x|'$_j$, where $u_j$ is the upper bounding constraint. In the running example, applying the shadow rule to the clauses (b<d $\vee$ c<d) and (d<a), on the variable d which is in conflict, yields (b<a $\vee$ c<a). That is, the clause (b<a $\vee$ c<a) is the new clause whose feasible set for the variable d is the intersection of the feasible sets for the clauses (b<d $\vee$ c<d) and (d<a). This new clause resulting from application of the shadow rule may be denoted in a shorter notation by using $shad_{xi}$(s, s').

In the GNBA search algorithm, the shadow rule is applied to pairs of clauses (s, s') that are compatible with the structure A. To define this notion, a corresponding definition on intervals is introduced. Given two intervals I and I', let the glue of the two intervals, glue(I, I'), be the interval that takes its lower bound from I and its upper bound from I'. For example, glue(($-\infty$, 5), [-1, 3])=($-\infty$, 3]. Note that this glue operator is not commutative, and is not the convex hull operator. An ordered pair of intervals I, I' is compatible if the glue of the two intervals is equal to the union of the two intervals, or glue(I, I')=I$\cup$I'. Examples of compatible pairs are ($-\infty$, 0), [0,$\infty$) and (3, 5], (4, 7]. Examples of incompatible pairs are ($-\infty$, 0), (0,$\infty$) and (4, 5], (3, 7]. The pair of intervals ($-\infty$, 0), (0,$\infty$) are not compatible because the value 0 is missing from both (the round bracket or open parenthesis indicates that the interval is "open", an end point is not present).

For any structure A, clause s, and variable $x_i$, the feasible set feas(A, s, $x_i$) is the complement of an interval, referred to as the forbidden interval and denoted as fbd(A, s, $x_i$). For example, for structure (a=0, b=0, c=0) and clause (c+5<a $\vee$ b$\leq$c) the forbidden interval for c is [-5, 0). The forbidden interval is the set of rational numbers that are not in the feasible set. Thus, forbidden interval is the complement of the feasible set. In effect, the shadow rule applies the glue operator to the forbidden intervals of two clauses. A pair of clauses is compatible when their forbidden intervals are compatible as stated in the following definition.

Compatible Definition

Given structure A and clauses $s_1$, $s_2$ dominated by variable $x_i$, the pair of clauses or sentences ($s_1$, $s_2$) is compatible when the pair of forbidden intervals fbd(A, $s_1$, $x_i$), fbd(A, $s_2$, $x_i$) is compatible. The pair of clauses or sentences ($s_i$, $s_2$) is strictly compatible when, further, the forbidden interval of the first clause fbd(A, $s_1$, $x_i$) does not equal the forbidden interval of the clause fbd(A, $s_2$, $x_i$), that is, fbd(A, $s_1$, $x_i$)≠fbd(A, $s_2$, $x_i$).

Feasibility Theorem

Since taking the union of the forbidden intervals corresponds to taking the intersection of the feasible sets, the following feasibility theorem can be formed and proved.

For any QFLRA structure A and compatible pair of clauses ($s_1$, $s_2$) of QFLRA, and any variable $x_i$:

$$\text{feas}(A, \text{shad}_{xi}(s_1, s_2), x_i) = \text{feas}(A, s_1, x_i) \cap \text{feas}(A, s_2, x_i)$$

This feasibility theorem can be proved as follows. Let $I_1$ and $I_2$ be the forbidden intervals of $s_1$ and $s_2$, respectively. It can be shown that the forbidden interval of $\text{shad}_{xi}(s_1, s_2)$ is glue($I_i$, $I_2$). Since ($s_1$, $s_2$) is compatible, glue($I_i$, $I_2$) is $I_1 \cup I_2$, which gives us the theorem by DeMorgans's laws.

The GNBA search procedure places one additional restriction on deductions. A clause or sentence s which is a member of the set of sentences S (s∈S) is minimal for a given variable $x_i$, if there is no other clause or sentence t where t∈S such that the feasibility of t is a subset of the feasibility of s, that is feas(A, S, t) ⊂ feas(A, S, s). The set of such minimal clauses is denoted by the notation $\text{minim}_{\sqsubset}$ (A, S, $x_i$). Restricting deduction to minimal clauses, repetition of deductions can be avoided.

With these provisos, the GNBA algorithm is a decision procedure for QFLRA. Partial correctness is trivial, since a result can only be returned in case the structure A is a satisfying assignment, or a false sentence F is deduced. As discussed further herein, the procedure must terminate successfully without aborting.

Continuing with the running example, recall our structure $A_2$ is (a=0, b=1, c=1, d=0) and it was deduced that (b<a ∨ c<a). Now the variable c is the least incorrect variable in the deduced clause. Note that the clause (a<c) has a forbidden interval (−∞, 0] while the clause (b<a ∨ c<a) has a forbidden interval [0,∞). These are strictly compatible, so the shadow rule can be further applied to obtain another mutated clause or sentence (b<a ∨ <0). The second inequality in this clause or sentence may be ignored, since it equivalent to False. Further evaluating this clause, the feasible set for the variable b is empty. The shadow rule can be further applied to the clauses (a<b) and (b<a), to obtain the new clause (0<0). Since the inequality (0<0) is equivalent to False, the structure A is reported to be unsatisfiable (UNSAT) by the verification output interface 160.

Termination of the GNBA Algorithm for QFLRA

With the GNBA algorithm being instantiated for QFLRA, a mutation changes the value of one rational variable, and the deduction relation is defined by the shadow rule described previously. The search heuristic places a priority on correcting the least incorrect variable according to the fixed variable ranking or order ⊑. Given two states (S,A) and (S',A') whose least incorrect variables are $x_i$ and $x_i$' respectively, the state (S,A) is greater than the state (S',A') in the ranked order, (S,A)≻(S',A'), when the variable $x_i$ is ranked lower than $x_i$' ($x_i \sqsubset x_i$'). That is, progress is made when the least incorrect variable is increased. In case of a tie, when $x_i = x_i$', the state (S,A) is greater than the state (S',A') in the ranked order, (S,A)≻(S',A'), if and only if the clauses s in the set S dominated by variable $x_i$ is a subset of the clauses s' in the set S' dominated by variable $x_i$, that is, domin(S, $x_i$) ⊂ domin(S', $x_i$). Intuitively, more constraints on $x_i$ make the problem more difficult to solve.

Now consider the three sufficient properties for termination: progress, boundedness and deadlock freedom.

Progress is easily guaranteed, since a mutation must increase the least incorrect variable and this cannot be done infinitely.

Boundedness is a property of the shadow rule. An instance of the shadow rule is ordered with respect to the total order or ranking ⊑ on the variables, if the same variable $x_i$ dominates both premises. Note that the search algorithm applies the shadow rule to clauses s and s' dominated by $x_i$, so ordered instances are used.

Lemma 1

Given that ordered instances of the variables are used, a first lemma may be proposed and proved as follows.

For any total order ⊑ on variables, the ordered shadow rule is bounded.

Consider the set of constraints C occurring in a finite set S of clauses. The ordered shadow rule creates a new constraint by applying transitivity, eliminating the highest variable. Since there can be no infinite chains of such deductions, the set of constraints generated from S is finite. Since every deduced clause is a disjunction over this finite set, the deductive closure of S is finite.

Lemma 2

To show that the deadlock-freedom property exists for termination, the following property of intervals may be used.

For any finite set of intervals I, such that the union of the set of intervals is Q (∪I=Q), either the union Q is a member of the finite set I of intervals (Q∈I), or the finite set of intervals I contains a strictly compatible pair.

If a model search step cannot be executed, it is because the feasible set of some variable $x_i$ is empty. This means that the forbidden intervals of $\text{minim}_{\sqsubset}$ (A, S, $x_i$) cover the real line. Under the latter lemma above, the forbidden intervals must contain a strictly compatible pair (s, s'). By applying the shadow rule to the corresponding clauses, a new clause t is obtained with a strictly smaller feasible set than the clauses s, s'. If the feasible set of t for $x_i$ is empty, then the structure A does not satisfy the new clause t (|≠t) and the variable $x_i$ does not occur in the new clause t. Thus, the least incorrect variable has been reduced. Otherwise, the minimality of the clauses s and s' implies that the new clause t is not already present in the set of clauses or sentences S, and thus the domin(S, $x_i$) is increased. In either case, a move is made up in the heuristic order ≻, making this a legal deduction step.

Since the three sufficient conditions for termination hold, it follows that the GNBA algorithm of QFLRA terminates.

Theorem 3

Unlike a Boolean SAT case, the variable order should not be arbitrarily changed during execution of the solver because an unordered shadow rule is not bounded. Cases can easy be constructed in which regularly changing the variable order leads to non-termination. For this reason, care should be taken in developing dynamic variable ordering strategies for QFLRA without sacrificing termination.

Figure 4:
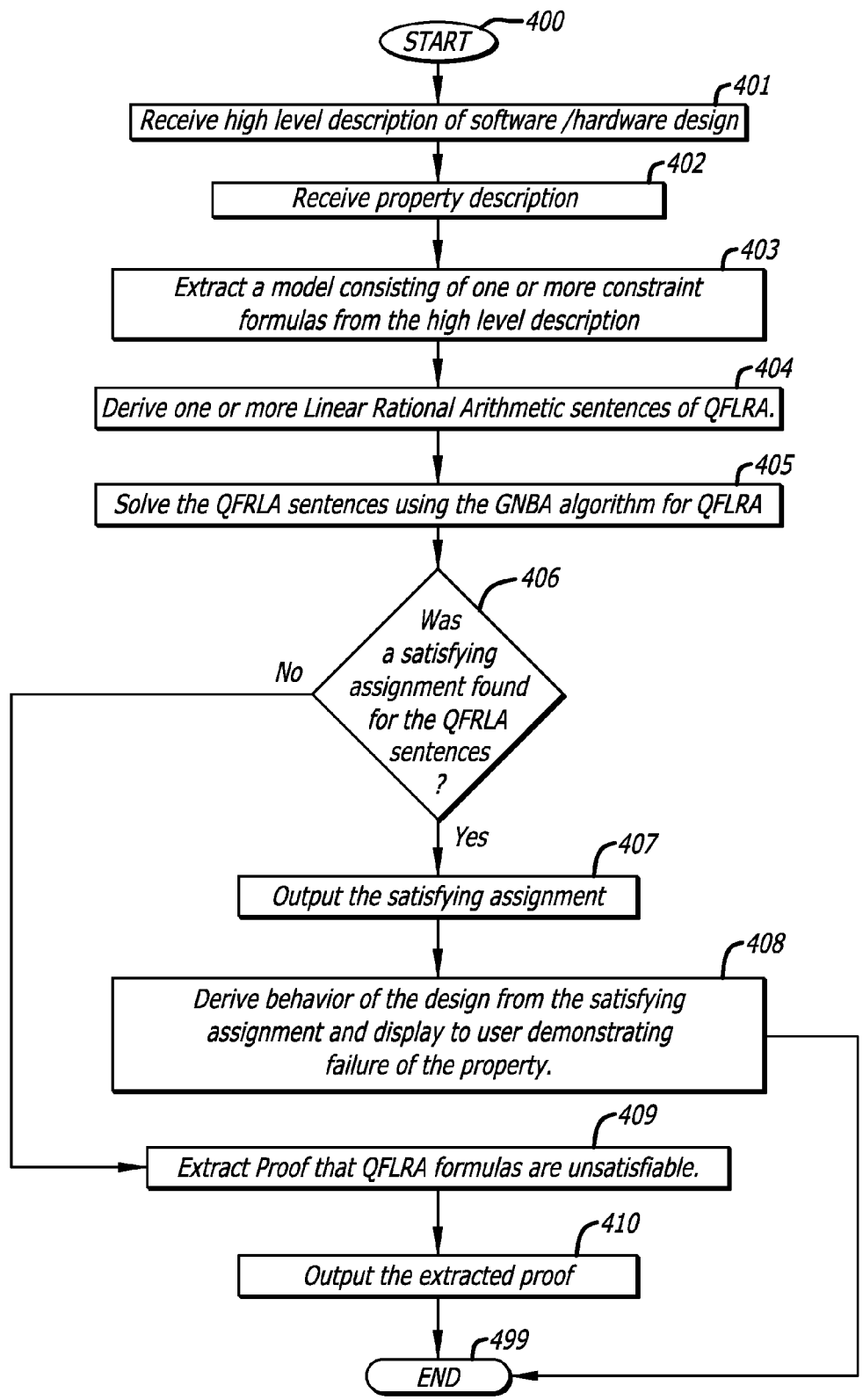
FIG. 4 is a flow chart diagram illustrating an operational flow of the design verifier of FIG. 1, according to another embodiment of the invention.

Referring now to FIG. 4, an operational method of the design verifier 100 using the GNBA algorithm for QFLRA is now described. The process starts at block 400 and then goes to block 401.

At block 401, a high level description of software and/or a hardware design is received by the design description interface 110. The high level description may be written in accordance with a hardware description language (HDL). A set of logical formulas or constraints are extracted from the high level description of the software or hardware, At block 402, a property description describing a property is received by the property description interface 120. The property may be a functional property of the hardware designed or software design that is to be verified. The process then goes to block 403.

At block 403, a model of the design, typically consisting of consisting of one or more constraint formulas or logical formulas, is extracted from the received high level description of the design by the model extractor 125. The process then continues to block 404.

At block 404, the Bounded Model Checker 130 derives one or more linear rational arithmetic sentences of QFLRA, such that the sentences are satisfiable exactly when the software and/or hardware system may violate the given property within a given fixed number K of execution steps. The process then goes to block 405.

At block 405, the GNBA algorithm for QFLRA (FIG. 6) is used to solve the QFLRA sentences. This results in either a satisfying assignment A, or UNSAT.

The satisfiability of the set of logical formulas or constraints is determined by a search preformed in a space of non-Boolean structures for a model or a satisfying assignment to the set of logical formulas or constraints. If a conflict occurs during the search, new formulas or constraints may be deduced in order to overcome the conflict and continue with the search for the model or satisfying assignment.

In general, the search is for a sequence of mutations to a structure according to a prescribed rule. This rule is represented by the mutation relation >illustrated in FIG. 5. Many such mutation rules may be practicable, depending on the kind of logic and the form of structure being used. A conflict occurs when it is impossible to mutate the structure according to the prescribed rule in order to satisfy one or more of the logical formulas or constraints, or in general to move the search closer to completion. In case of a conflict, a process of deduction derives a new formula or constraint from the set of formulas or constraints that, when added to the set of constraints or formulas, allows the sequence of mutations to continue. Typically, the new formula or clause is derived from the specific formulas or clauses that are directly responsible for the conflict.

More specifically, the structure may be an assignment of values to variables or other entities such that the values are not exclusively Boolean. A mutation to the structure comprises assigning a value to a variable or other entity in the structure or modifying its value in the structure. A conflict in this case is the inability to assign a value to a variable or other entity in order to satisfy one or more of the logical formulas or constraints (that is, a conflict occurs because the feasible set of a variable is empty). The deduction comprises deriving a new formula or constraint from the logical formulas or constraints that eliminates the variable in question or reduces the feasible set of that variable relative to the logical formulas or constraints.

In particular, the logical formulas or constraints may consist of clauses of quantifier-free linear arithmetic. The structure may consist of an assignment of numeric values to variables, and the deduction may consist of applying the shadow rule described herein. When the search is completed, either a satisfying assignment, or a derivation of the sentence False is obtained, indicating an UNSAT condition. The process then goes to block 406.

At block 406, a determination is made as to whether or not a satisfying assignment A was found for the QFLRA sentences. If a solution was found, the process goes to block 407. Otherwise if an UNSAT result is obtained, the process goes to block 409 and continues.

At block 407, the satisfying assignment A is transmitted to the verification output interface 160. The process goes to block 408.

At process block 408, the verification output interface 160 derives from the satisfying assignment A a behavior of the software and/or hardware design which may be displayed to the user, and demonstrates the failure of the property. The process then goes to block 499 and ends.

At block 409, the Proof Generator 132 extracts from the state of the search algorithm a proof that the QFLRA formulas are unsatisfiable. The process goes to process 410.

At process block 410, the extracted proof is transmitted to the verification output interface 160. The extracted proof may be used for various purposes, including proof-based abstraction, as described above. The process then goes to block 499 and ends.

In the instantiation of GNBA algorithm for linear rational arithmetic, there are several significant differences with respect to the lazy SMT approach. First, the GNBA searches in the space of assignments to rational variables, while lazy SMT searches in the space of Boolean assignments to atoms (in this case the inequalities). Second, theory deduction in GNBA is performed in response to a conflict in the model search. In lazy SMT, theory deduction occurs in response to satisfying Boolean assignments (or partial assignments). Third, GNBA applies proof rules of the theory, while lazy SMT uses axioms generated by the theory solver. While the lazy theory solver generates tautologies of the theory, the GNBA procedure does not deduce tautologies. Every clause generated by the GNBA procedure is derived from the original problem clauses and is false in some structure (the one generating the conflict). In lazy SMT, Boolean and theory reasoning are deliberately separated. The theory solver cannot resolve problem clauses, because it never sees them. With the GNBA algorithm, there is no such separation such that problem clauses may be resolved.

From a heuristic point of view, Boolean assignments generated by the SAT solver with a lazy SMT algorithm provide inadequate guidance to the theory solver as to which of many possible refutations is preferred. In principle, for any deduction performed using the shadow rule disclosed herein, a theory solver could provide a sufficient set of axioms to allow the SAT solver to reproduce the conclusion by a sequence of resolution steps. However, in practice, the lazy SMT procedure lacks the heuristic guidance needed to produce this result.

Figure 8A:
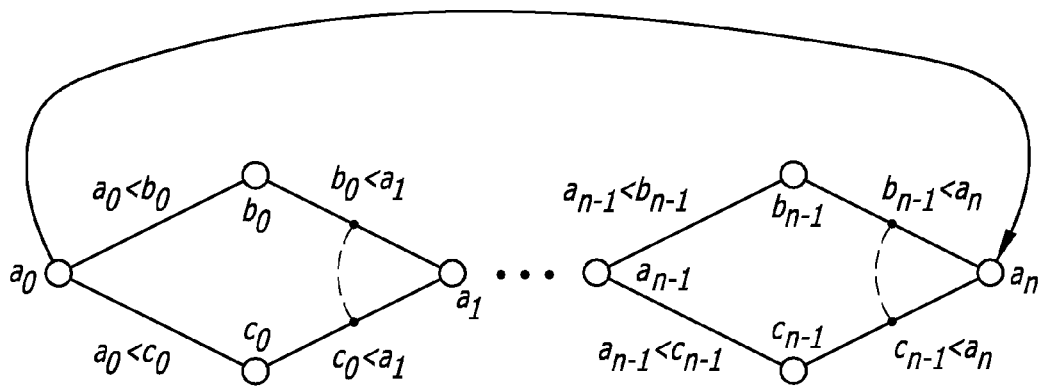
FIG. 8A illustrates a class of diamond formulas.

Referring now to FIG. 8A, consider for example a class of diamond formulas. The running example described herein is a diamond formula for N=1. FIG. 8A depicts a problem graph for the general case of a diamond formula with N diamonds. In each of the graphs illustrated in FIGS. 8A-8B, a line with an arrowhead between variables represents a constraint and a dashed line between arrowhead lines indicates a disjunction of constraints.

Figure 8B:
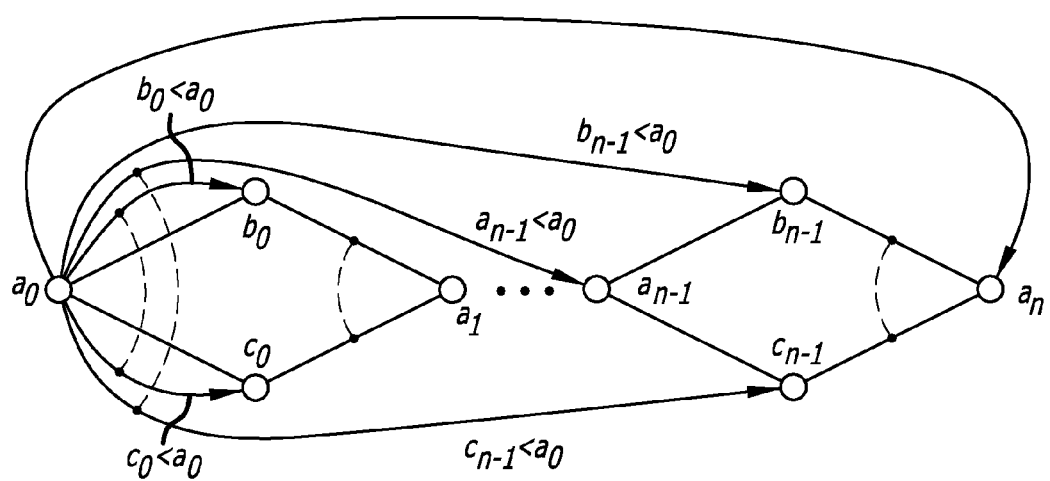
FIG. 8B illustrates deduction performed by the GNBA algorithm for the problem illustrated in FIG. 8A.

FIG. 8B illustrates a deduced graph showing deduction by the GNBA algorithm of the clauses in the problem graph illustrated in FIG. 8A. The clauses in the problem graph shown in FIG. 8A are deduced with the GNBA algorithm by repeating three steps as follows:

$$(b_{i-1} < a_i \vee c_{i-1} < a_i), (a_i < a_0) \vdash (b_{i-1} < a_0 \vee c_{i-1} < a_0); \quad (1)$$

$$(b_{i-1} < a_0 \vee c_{i-1} < a_0), (a_{i-1} < c_{i-1}) \vdash (b_{i-1} < a_0 \vee a_{i-1} < a_0); \text{ and} \quad (2)$$

$$(b_{i-1} < a_0 \vee a_{i-1} < a_0), (a_{i-1} < b_{i-1}) \vdash (a_{i-1} < a_0). \quad (3)$$

The GNBA procedure described herein can show unsatisfiability of these formulas in a number steps linear in N, the number of diamonds.

FIG. 8B shows the deduction sequence for any order N for the variable order $a_0, b_0, c_0, a_1, b_1, c_1, \ldots, a_{n-1}, b_{n-1}, c_{n-1}, a_n$. This result is not particularly sensitive to variable order. For example, the variable order $a_0, \ldots, a_n, \ldots, b_0, \ldots, b_{n-1}, c_0, \ldots, c_{n-1}$ also yields a linear number of steps. This procedure is deterministic in that once the variable order is chosen, the sequence of deductions is fixed. The conflicts in model search precisely informs which deductions to perform.

Note that there may be other methods that can handle diamond formulas efficiently. The foregoing is an example to illustrate the heuristic difficulties faced by a lazy SMT solver, and to show how searching in the space of numerical assignments avoids these difficulties.

Note also that the shadow rule described herein used for QFLRA is only one of many possibilities. For example, Linear Arithmetic into Superposition Calculus (LASCA), a proof calculus, has three proof rules that deal with inequalities. By combining these three proof rules, many conclusions can be generated whose feasible set is the intersection of the feasible sets of the premises. Thus, while deduction in GNBA is guided by conflict, it is not always fully determined, as it was in the example above.

There are other related proof methods that may be used with the GNBA algorithm. Exhaustive methods, such as the Fourier-Motzkin elimination, performs all possible deductions without any heuristic guidance. Eager variable elimination uses resolution steps to simplify the formula in a preprocessing step. This method can also be used with GNBA.

To evaluate the performance potential of GNBA, two experiments were performed using a prototype implementation of the linear arithmetic decision procedure using the GNBA algorithm.

For these experiments, a simple static variable ordering heuristic was used. Boolean SAT solvers generally base their initial variable ordering on the number of occurrences of each variable. However in the case of QFLRA, the numerical relationships between variables are also exploited.

A directed graph, such as that shown in FIG. 8A was constructed in which the vertices are variables, and an edge (x, y) occurs when there is a unit constraint, such as x<y, in which is upper-bounding for x and lower-bounding for y (thus, increasing x may force us to increase y). A depth first search (DFS) based heuristic was used to order the nodes of the directed graph in an attempt to reduce the number of back edges in the graph. This reduces the number of times that a variable will have to be updated because its predecessor is updated.

In the first experiment, the GNBA solver was used on diamond structures shown in FIG. 8A for sizes or orders of N ranging from 1 to 25. The GNBA implementation solved all the diamond problems in a negligible amount of time, while a lazy SMT solver required exponentially increasing time in N.

In the second experiment, the GNBA solver's performance was evaluated for a simplified circuit timing analysis problem. Instead of a directed graph, a timing graph is formed for an exemplary circuit with timing constraints generated from the exemplary circuit using simple gate delays. Coincidental arrival time was also modeled given that the delay of a CMOS gate increases if the two latest inputs arrive at approximately the same time. For example, suppose the arrival times of a two-input gate are denoted by $t_1$, $t_2$ and $t_o$ for the two inputs and for the output, respectively. The following inequalities model the described timing behavior of that gate:

$$(t_o \geq t_1 + \delta_{small}) \wedge$$

$$(t_o \geq t_2 \delta) \wedge$$

$$((t_o > t_2) \vee (t_o \geq t_1 + \delta_{large})) \wedge$$

$$((t_2 > t_1) \vee (t_o \geq t_2 + \delta_{large}))$$

For each circuit, timing constraints for all gates are generated and added to the timing graph. For every output an additional constraint is added. This additional constraint for every output requires that its arrival time be less than or equal to its precomputed arrival time for a SAT case and strictly less than for an UNSAT case. The experiments showed that the GNBA algorithm performed well in evaluating the circuit in all cases. On the other hand, using a lazy SMT solver, performance was in some cases significantly slower, possibly because a large number of timing paths in the circuits had to be individually refuted by the theory solver.

Generally these results demonstrate that the GNBA algorithm has significantly different performance characteristics from lazy SMT and that its use of a model search to drive theory deduction can be an effective heuristic.

Computer System

Figure 9:
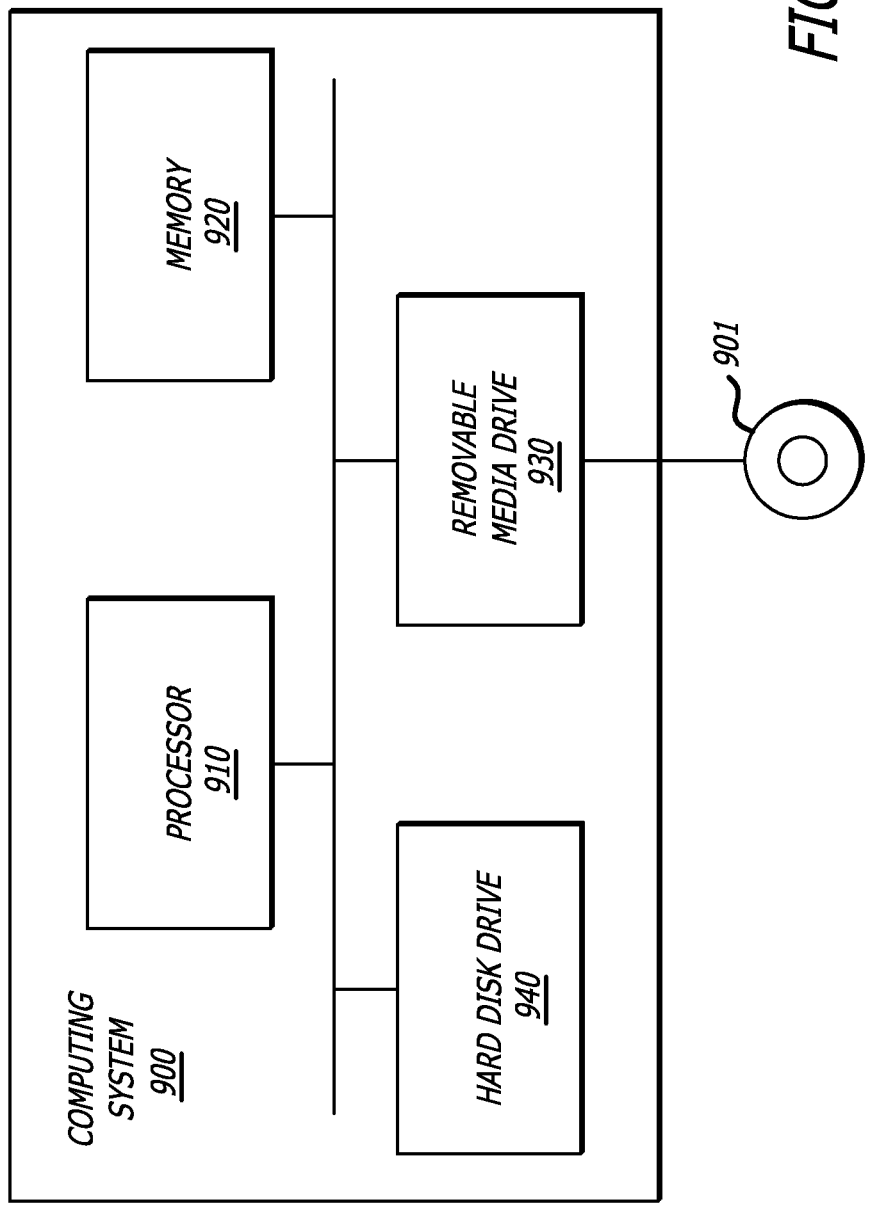
FIG. 9 is a block diagram depicting an exemplary computer system for execution of the algorithms and software instructions described herein.

Referring now to FIG. 9, a computing system 900 is illustrated that may be used to perform some or all of the processes in accordance with a number of embodiments of the invention. In one embodiment of the invention, the computing system 900 includes a processor 910, a memory 920, a removable media drive 930, and a hard disk drive 940. In one embodiment, the processor 910 executes instructions residing on a machine-readable medium, such as the hard disk drive 940, a removable medium 901 (e.g., an optical medium (compact disk (CD), digital video disk (DVD), etc.), a magnetic medium (magnetic disk, a magnetic tape, etc.), or a combination of both. The instructions may be loaded from the machine-readable medium into the memory 920, which may include Random Access Memory (RAM), dynamic RAM (DRAM), etc. The processor 910 may retrieve the instructions from the memory 920 and execute the instructions to perform the operations described above.

Note that any or all of the components and the associated hardware illustrated in FIG. 9 may be used in various embodiments of the system 900. However, it should be appreciated that other configurations of the system 900 may include more or less devices than those shown in FIG. 9.

Some portions of the preceding detailed description have been presented in terms of algorithms and symbolic representations of operations on data bits within a computer memory. These algorithmic descriptions and representations are the tools used by those skilled in the data processing arts to most effectively convey the substance of their work to others skilled in the art. An algorithm is here, and generally, conceived to be a self-consistent sequence of operations leading to a desired result. The operations are those requiring physical manipulations of physical quantities. Usually, though not necessarily, these quantities take the form of electrical or magnetic signals capable of being stored, transferred, combined, compared, and otherwise manipulated. It has proven convenient at times, principally for reasons of common usage, to refer to these signals as bits, values, elements, symbols, characters, terms, numbers, or the like.

It should be kept in mind, however, that all of these and similar terms are to be associated with the appropriate physical quantities and are merely convenient labels applied to these quantities. Unless specifically stated otherwise as apparent from the above discussion, it is appreciated that throughout the description, discussions utilizing terms such as "processing" or "computing" or "calculating" or "determining" or "displaying" or the like, refer to the action and processes of a computer system, or similar electronic computing device, that manipulates and transforms data represented as physical (electronic) quantities within the computer system's registers and memories into other data similarly represented as physical quantities within the computer system memories or registers or other such information storage, transmission or display devices.

The embodiments of the invention also relates to an apparatus for performing the operations described herein. This apparatus may be specially constructed for the required purposes, or it may comprise a general-purpose computer selectively activated or reconfigured by a computer program stored in the computer. Such a computer program may be stored in a computer readable storage medium, such as, but is not limited to, any type of disk including floppy disks, optical disks, CD-ROMs, and magnetic-optical disks, read-only memories (ROMs), random access memories (RAMs), EPROMs, EEPROMs, magnetic or optical cards, or any type of media suitable for storing electronic instructions, and each coupled to a computer system bus.

The processes and displays presented herein are not inherently related to any particular computer or other apparatus. Various general-purpose systems may be used with programs in accordance with the teachings herein, or it may prove convenient to construct a more specialized apparatus to perform the operations described. The required structure for a variety of these systems will appear from the description below. In addition, the embodiments of the invention is not described with reference to any particular programming language. It will be appreciated that a variety of programming languages may be used to implement the teachings of the invention as described herein.

A machine-readable medium includes any mechanism for storing or transmitting information in a form readable by a machine (e.g., a computer). For example, a machine-readable medium includes read only memory ("ROM"); random access memory ("RAM"); magnetic disk storage media; optical storage media; flash memory devices; electrical, optical, acoustical or other form of propagated signals (e.g., carrier waves, infrared signals, digital signals, etc.); etc.

CONCLUSION

The GNBA algorithm is an approach to constraint solving (including SMT solving) in which model search and proof interact. The GNBA algorithm employs a deduction system by using conflict in model search as a guide. The resulting deduced clauses in turn guide the model search away from the conflict. With the GNBA algorithm, deduction occurs in response to search conflicts.

The GNBA algorithm is distinguished from DPLL SAT solvers in that it searches in a space of non-Boolean structures. For example, it may search for a model in a space of numerical assignments to variables, or other non-Boolean structures such as finite first-order structures. By contrast, DPLL SAT solvers search in a space of assignments of Boolean values to variables, while lazy SMT solvers search in a space of Boolean assignments to atoms of the logic.

The GNBA algorithm is distinguished from other prior approaches to the constraint satisfaction problem (CSP) that search in the space of numeric assignments in that it deduces new constraints in response to search conflicts, while prior methods simply backtrack. In this sense, GNBA can be thought of as applying the DPLL approach to more general classes of constraints.

The GNBA algorithm is a general approach that can be applied to various non-propositional theories. For example, the GNBA algorithm is applicable to linear arithmetic, so that a search in the space of numerical assignments may be made instead of Boolean assignments. This allows the approach to solving an SMT problem to focus on arithmetic deduction as well as propositional deduction.

Other approaches to the solving the SMT problem lack heuristic guidance in learning theory facts. For example, that the ability to use model search to guide deduction may allow the GNBA algorithm to avoid an exponential explosion of Boolean combinations that may occur with lazy SMT solvers.

A general framework has been developed for the GNBA algorithm to guide reasoning in a broad range of theories. Versions of the GNBA algorithm have been implemented for quantifier-free equality with uninterpreted functions and quantified first-order logic without equality.

Embodiments of a design verifier using a GNBA algorithm are described herein. In the above description, numerous specific details are set forth (e.g., an arithmetic satisfiability solver) to provide a thorough understanding of embodiments of the invention. One skilled in the relevant art will recognize, however, that embodiments of the invention can be practiced without one or more of the specific details, or with other methods, components, materials, etc. In other instances, well-known structures, materials, or operations are not shown or described in detail to avoid obscuring the description.

Reference throughout this specification to "one embodiment" or "an embodiment" means that a particular feature, structure, or characteristic described in connection with the embodiment is included in at least one embodiment of the present invention. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments.

In addition, embodiments of the present description may be implemented not only within a semiconductor chip but also within machine-readable media. For example, the designs described above may be stored upon and/or embedded within machine readable media associated with a design tool used for designing semiconductor devices. Examples include a netlist formatted in the very high speed integrated circuit (VHSIC) hardware description language (VHDL), Verilog language, or a simulation program with integrated circuit emphasis (SPICE) language. Some netlist examples include: a behavioral level netlist, a register transfer level (RTL) netlist, a gate level netlist and a transistor level netlist. Machine-readable media also include media having layout information such as a graphic data system (GDS) II file. Furthermore, netlist files or other machine-readable media for semiconductor chip design may be used in a simulation environment to perform the methods of the teachings described above.

Thus, embodiments of this invention may be used as or to support a software program executed upon some form of processing core (such as the central processing unit or microprocessor of a computer) or otherwise implemented or realized upon or within a machine-readable medium. A machine-readable medium includes any mechanism for storing or transmitting information in a form readable by a machine (e.g., a computer). For example, a machine-readable medium can include such as a read only memory (ROM); a random access memory (RAM); a magnetic disk storage media; an optical storage media; and a flash memory device, etc. In addition, a machine-readable medium may include propagated signals such as electrical, optical, acoustical or other form of propagated signals (e.g., carrier waves, infrared signals, digital signals, etc.).

The above description of illustrated embodiments of the invention, including what is described in the Abstract, is not intended to be exhaustive or to be limitation to the precise forms disclosed. While specific embodiments of, and examples for, the invention are described herein for illustrative purposes, various equivalent modifications are possible, as those skilled in the relevant art will recognize.

These modifications can be made to embodiments of the invention in light of the above detailed description. The terms used in the following claims should not be construed to limit the invention to the specific embodiments disclosed in the specification and the claims. Rather, the scope is to be determined entirely by the following claims, which are to be construed in accordance with established doctrines of claim interpretation.

What is claimed is:

1. A method for verifying a design of a system, the method comprising:
   receiving a high level design description of a design for a system;
   extracting a set of logical formulas from the high level design description of the design, wherein the logical formulas are clauses of quantifier-free linear arithmetic; and
   determining satisfiability of the set of logical formulas including
      searching in a space of non-Boolean structures for a satisfying assignment to the logical formulas, including generating a sequence of mutations to a structure according to a prescribed rule, wherein the structure is an assignment of numeric values to variables occurring in the logical formulas; and
      deducing one or more new logical formulas in response to one or more conflicts in the searching in the space of non-Boolean structures for the satisfying assignment, including applying a shadow rule, wherein the shadow rule is a deduction rule that resolves conflicts in the assignment of numeric vales to variables by generating a new clause defining a feasible set of values for a variable from the intersection of feasible sets of values for the variable from a pair of compatible clauses;
   wherein one or more of the receiving, extracting, or determining are performed with a processor.

2. The method of claim 1, wherein
   the shadow rule deduces one or more logical formulas causing the one or more conflicts in the search for the satisfying assignment to resolve the one or more conflicts.

3. The method of claim 1, wherein
   a conflict is the inability to mutate the structure according to the prescribed rule to satisfy one or more logical formulas.

4. The method of claim 3, wherein
   from the set of logical formulas, the deducing comprises deriving one or more new logical formulas to respectively overcome the one or more conflicts and resume the searching when the one or more new logical formulas are added to the set of logical formulas.

5. The method of claim 1, wherein
   the structure comprises an assignment of values to variables such that the values are not exclusively Boolean, and
   the generation of a mutation comprises assigning a value to a variable in the structure or modifying a value in the structure.

6. The method of claim 5, wherein
   a conflict is the inability to assign a value to a variable in order to satisfy one or more formulas, and
   from the set of logical formulas, the deducing comprises deriving one or more new logical formulas that eliminate at least one variable associated with a conflict.

7. The method of claim 5, wherein
   a conflict is the inability to assign a value to a variable in order to satisfy one or more formulas, and
   from the set of logical formulas, the deducing comprises reducing the feasible set of at least one variable.

8. The method of claim 6, wherein
   the system is an integrated circuit, and
   the high level design description is a hardware description written in a high-level design language describing functional blocks and computational elements of the integrated circuit design and functional properties thereof.

9. The method of claim 5, wherein
   the system is a computer program,
   the high level design description comprises instructions written in a computer programming language describing the behavior of the computer program.

10. A non-transitory machine readable media having stored thereon instructions that when executed by a machine causes the machine to perform operations comprising:
    receiving a high level design description of a design for a system;
    extracting a set of constraints from the high level design description of the design, wherein the set of constraints is a set of clauses of quantifier-free linear arithmetic; and
    determining satisfiability of the set of constraints including
       searching in a space of non-Boolean structures for a model of the set of constraints including searching for a sequence of mutations to a structure according to a prescribed rule wherein the structure is an assignment of numeric values to variables and
       deducing one or more new constraints in response to one or more conflicts in the search for the model, including applying to existing constraints,
    wherein the shadow rule is a deduction rule that resolves conflicts in the assignment of numeric vales to variables by generating a new clause defining a feasible set of values for a variable from the intersection of feasible sets of values for the variable from a pair of compatible clauses.

11. The non-transitory machine readable media of claim 10, wherein
    a conflict is the inability to mutate the structure according to the prescribed rule in order to satisfy one or more constraints.

12. The non-transitory machine readable media of claim 10, wherein
from the set of constraints, the deducing comprises deriving the one or more new constraints which when added to the set of constraints allows the search to continue.

13. The non-transitory machine readable media of claim 10, wherein
the structure comprises an assignment of values to entities such that the values are not exclusively Boolean, and
the generation of a mutation comprises assigning a value to an entity in the structure or modifying its value in the structure.

14. The non-transitory machine readable media of claim 13, wherein
a conflict is the inability to assign a value to an entity in order to satisfy one or more constraints, and
the deducing comprises deriving at least one new constraint from the existing constraints such that a dependency on at least one entity associated with a conflict is eliminated.

15. The non-transitory machine readable media of claim 13, wherein
a conflict is the inability to assign a value to an entity in order to satisfy one or more constraints, and
the deducing comprises deriving at least one new constraint from the existing constraints, such that the feasible set of at least one entity is reduced.

16. A design verification system to verify a hardware or software design, the design verification system comprising:
a processor to execute instructions; and
a storage device coupled to the processor, the storage device storing instructions that when executed by the processor perform the operations including
extracting from a design a set of logical formulas or constraints, and
determining the satisfiability of the set of logical formulas or constraints by
searching in a space of non-Boolean structures for a model or a satisfying assignment to the set of logical formulas or constraints, including searching for a sequence of mutations to a structure according to a mutation rule, wherein
a mutation comprises assigning a value to a variable in the structure or modifying the value of a variable in the structure in response to the mutation rule,
and
deducing new formulas or constraints in response to one or more conflicts occurring in the search for the model or the satisfying assignment.

17. The design verification system of claim 16, wherein
a conflict is the inability to mutate the structure according to the mutation rule in order to satisfy one or more of the logical formulas or constraints; and
the deducing comprises deriving a new formula or a new constraint from the set of formulas or constraints that when added to the set of formulas or constraints allows the searching for the model or the satisfying assignment to continue.

18. The design verification system of claim 16, wherein
the structure comprises an assignment of values to variables or other entities such that the values are not exclusively Boolean;
a conflict is the inability to assign a value to a variable in order to satisfy one or more of the logical formulas or constraints, and
the deducing comprises deriving a new formula or constraint from the logical formulas or constraints that eliminates a variable or reduces the feasible set of logical formulas or constraints.

19. The design verification system of claim 18, wherein
a) the formulas or constraints consist of clauses of quantifier-free linear arithmetic
b) a structure consists of an assignment of numeric values to variables, and
c) a deduction consists of applying the shadow rule to existing formulas or constraints.

20. The design verification system of claim 16, wherein
the storage device stores further instructions that when executed by the processor perform further operations including
receiving the design description of the hardware or software design; and
receiving a functional property of the hardware or software design to verify.

* * * * *